United States Patent [19]
Schatz

[11] Patent Number: 5,812,013
[45] Date of Patent: Sep. 22, 1998

[54] METHOD AND APPARATUS FOR CALIBRATING INTEGRATED CIRCUITS

[75] Inventor: Oliver Schatz, Reutlingen, Germany

[73] Assignee: Robert Bosch GmbH, Stuttgart, Germany

[21] Appl. No.: 697,192

[22] Filed: Aug. 21, 1996

[30] Foreign Application Priority Data

Aug. 23, 1995 [DE] Germany .................. 195 30 900.6

[51] Int. Cl.$^6$ .................................................. H02H 7/20
[52] U.S. Cl. ........................ 327/525; 327/538; 327/427
[58] Field of Search .................... 327/525, 526, 327/538, 540, 427–431, 438; 326/38; 365/225.7, 96

[56] References Cited

U.S. PATENT DOCUMENTS 5,404,049  4/1995  Canada et al. ...................... 327/525
5,420,456  5/1995  Galbi et al. ........................ 327/525

OTHER PUBLICATIONS

Lower, "Blown Fuse Sensor", IBM Technical Disclosure Bulletin, vol. 13, No. 1, pp. 59–60, Jun. 1970.

"Elektronik", Horst Völz, Akademie–Verlag, Berlin 1986, pp. 751–752.

*Primary Examiner*—Timothy P. Callahan
*Assistant Examiner*—Eunja Shin
*Attorney, Agent, or Firm*—Frishauf, Holtz, Goodman, Langer & Chick, P.C.

[57] ABSTRACT

A method and an apparatus for calibrating an integrated circuit by blowing a fusible link. A blowing current is caused to flow through the fusible link via a switch element. When the fusible link blows to render it nonconductive, a sudden voltage pulse appears which is detected by a differentiating element and utilized to quickly turn off the switch element and, thereby, avoid damage to the integrated circuit.

10 Claims, 3 Drawing Sheets

METHOD AND APPARATUS FOR CALIBRATING INTEGRATED CIRCUITS

BACKGROUND OF THE INVENTION

The invention is directed to a calibration technique for integrated circuits involving blowing fusible links and, in particular, to accomplishing this task without damaging the integrated circuit.

It is known to calibrate certain parameters of an integrated circuit ("IC") with fusible links that are fabricated therewith to be conductive. A desired calibration can be attained by selecting one or more of the fusible links to be rendered nonconductive, or blown, by a suitable calibration apparatus coupled thereto by conductive supply leads. From the textbook entitled "Elektronik" by Horst Völz, Akademieverlage Berlin 1986, p. 751 ff., it is known to blow the fusible links by means of a brief current surge of fixed intensity and duration. The intensity and duration of the current surge must be chosen such that reliable blowing of the fusible links is assured; that is, more power is supplied than is as a rule necessary to blow the fusible links. If supply leads with high inductance are used, major voltage overshoots occur. To avoid such voltage overshoots, low-inductance supply leads are used. In practice, this means that the calibration apparatus must be located in the immediate vicinity of the IC chip to be calibrated.

SUMMARY OF THE INVENTION

An object of the invention is to calibrate an integrated circuit with a technique that relies on blowing fusible links, but to do so without causing any damage thereby to the circuits in the IC.

This and other objects of the invention are attained by a technique which applies a blowing current to a fusible link so as to render it nonconductive. When the fusible link is blown, this is detected and used to turn off the blowing current before any damage to the IC can occur.

The invention has the advantage that it prevents currents which could cause damage to the semiconductor circuits in the IC from still being able to flow after the fusible link has been blown. As a result, higher-inductance, i.e. longer, leads can be used between the calibration apparatus and the IC to be calibrated.

BRIEF DESCRIPTION OF THE DRAWINGS

Exemplary embodiments of the invention are described in further detail in the ensuing description taken together with the following drawings.

DETAILED DESCRIPTION OF THE PREFERRED EMBODIMENTS

Figure 1:
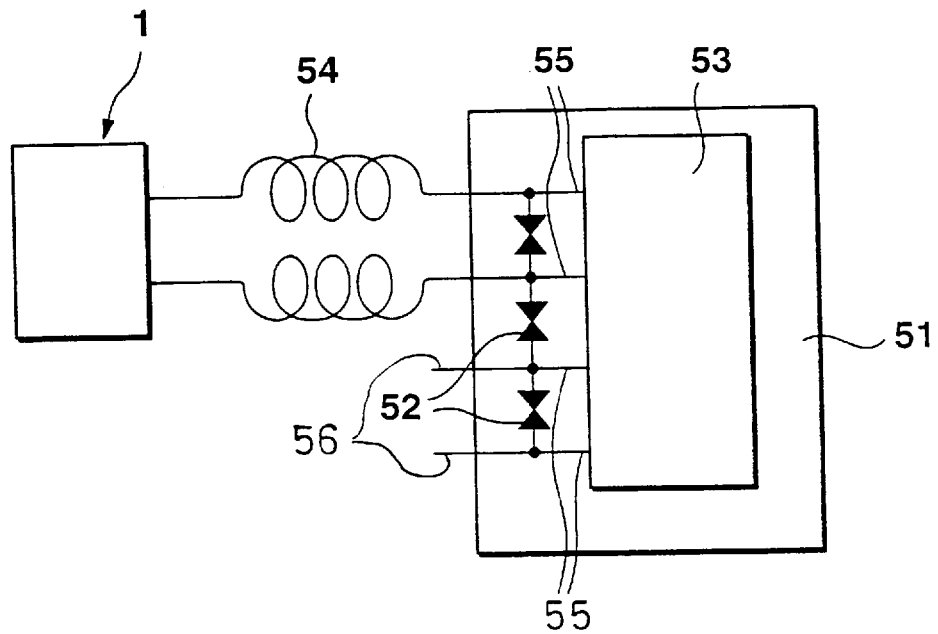
FIG. 1 shows the basic layout of the integrated circuit and the calibration apparatus.

In FIG. 1, an integrated circuit 51 is shown that has fusible links 52. The fusible links 52 are used to calibrate a circuit 53 which is part of the circuitry of IC 51. The fusible links 52 are connected to the circuit 53 by conductive paths 55 on IC 51. The fusible links 52 are also connected to external conductive paths 56, which lead out from the IC 51 and by means of which signals, supply voltages, and the like are exchanged between the integrated circuit 51 and other circuits and devices. By means of these external paths 56, the fusible links 52 can be connected to a calibration apparatus 1. Supply leads 54 are provided for this purpose. The supply leads 54 have an inductance. Connecting the calibration apparatus to various fusible links can also be done via switches integrated on the chip. In that case, however, some of the paths 55 are omitted.

The calibration apparatus 1 acts upon the fusible links 52 with a current flowing through the supply leads 54. As a result of this current flow through the fusible links 52, the conductivity of the fusible links 52 is changed irreversibly. For example, the fusible links 52 may comprise thin metal resistors applied by sputtering, which are heated by a current flow therethrough such that the metal material evaporates. The fusible links are then "blown", in other words switched irreversibly so that they are nonconductive.

When blowing of the fusible links 52 occurs, the current flow through the paths is disrupted abruptly. Because of the inductance of the supply leads 54, sudden voltage peaks can occur, which are applied through the external paths 56 and the paths 55 to the circuit 53 as well. Because of the steep switched edge of these inductive voltage peaks, they can cause triggering of parasitic thyristors in the circuit 53. If these parasitic thyristors are triggered, the current flow, which was previously carried via the fusible links 52, is thus carried over a portion of the circuit 53. This can destroy individual components of the circuit 53. To prevent this impairment of the circuit 53, clamp elements, which are switched to close (i.e. conduct) when a certain voltage is exceeded, may for instance be connected parallel to the fusible links 52. However, such clamp elements have the disadvantage of having to be designed relatively generously, so as to be capable of carrying the high current flow. A relatively large amount of chip area on IC 51 must, therefore, be devoted to these clamp elements. Another possibility is to keep the inductance of the supply leads 54 slight. However, that can be accomplished only if the calibration apparatus 1 is located in the immediate vicinity of the IC 51. That provision, in turn, may involve substantial effort and expense if the calibration is to take place under operating conditions, such as elevated temperature, imposition of pressure, or acceleration of the chip 51. Such a functional calibration is necessary if the IC 51 is needed to evaluate a sensor signal, for example.

Figure 4:
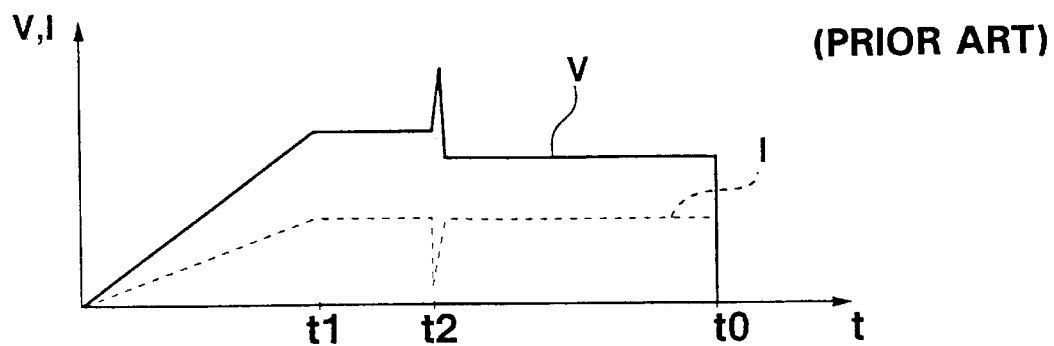
FIG. 4 shows the course of current and voltage in a method of the prior art.

In FIG. 4, the typical course of voltage and current in the conventional method is shown. Current I is the current through the leads 54, and voltage V is the voltage across the fusible links as applied via conductive paths 56. By means of the calibration apparatus 1, a pulse for blowing the fusible links 52 is applied to the supply leads 54. The pulse length to a time to is fixed. In a rising phase up to time t1, the power is driven upward; that is, in this range, both the voltage and the current rise linearly. At a time t1, a predetermined maximum voltage is reached. From time t1 on, a constant current flows through the fusible link 52 and heat builds up until the fusible link blows. Once the fusible link blows at time t2, the current flow is initially reduced because the resistance of the fusible link 52 rises abruptly. At the same time, because of induction, a steep rise in the voltage occurs. This steep voltage rise then ignites, i.e. triggers ON, parasitic thyristors of the circuit 53, and as a result the current flow is continued, but takes place through the circuit 53. Between times t2 and to, a current thus flows through the circuit 53. This current flow can damage the IC.

Figure 2:
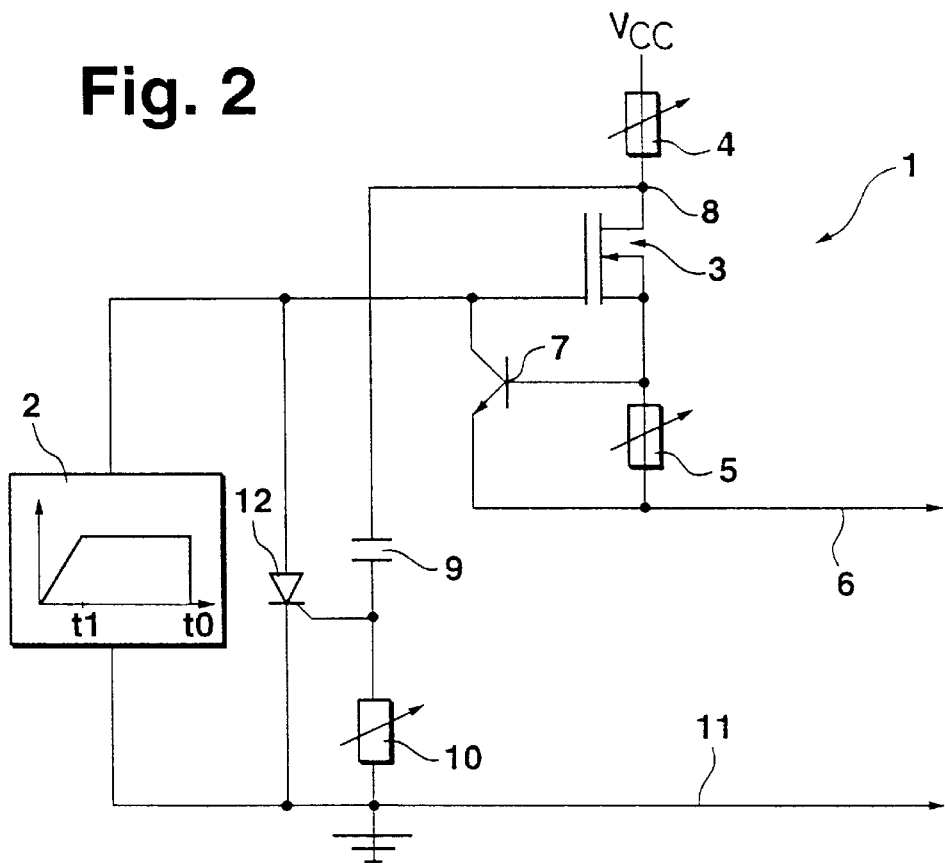
FIGS. 2 and 3 show two exemplary embodiments of a calibration apparatus.

In FIG. 2, a first exemplary embodiment of the calibration apparatus 1 of the invention is shown. The gate of a power transistor 3 is triggered by a pulse source 2. The pulse source 2 furnishes a voltage signal, which in a first time interval up to time t1 rises linearly from 0 to a predetermined voltage value. At a second, later time to, the signal is then returned to zero. The voltage signal of the pulse source 2 is applied to the gate of an MOS transistor 3. The drain terminal of the transistor 3 is connected to a supply voltage $V_{CC}$ via an adjustable resistor 4. The source terminal of the transistor 3 is connected to the output line 6 via an adjustable resistor 5. A transistor 7 is also provided, having its collector connected to the gate terminal of the MOS transistor 3, its base connected to a node between the source terminal of the transistor 3 and the resistor 5, and its emitter connected to the output line 6. In this example, the transistor 7 is an npn transistor. Between the drain of the MOS transistor 3 and the resistor 4, a node 8 is provided, which is connected to a second output line 11 via a capacitor 9 and an adjustable resistor 10. Connected between the gate of the MOS transistor 3 and the second output line 11 (ground) is a thyristor 12, having its control input connected to a node between the capacitor 9 and the resistor 10.

Blowing current flows to fusible links 52 through MOS transistor 3 and via output lines 6 and 11. The transistor 7 together with the resistor 5 forms a current limiter. The maximum blowing current that can flow from output line 6 to the fusible links 52 through the transistor 3 is thus limited. As a function of the current flowing through the transistor 3, a voltage drop is created across the resistor 5. Once this voltage across resistor 5 is high enough that the transistor 7 is turned ON, then the voltage applied to the gate of the MOS transistor 3 is reduced, and thus the current flow through the transistor 3 is likewise reduced. A maximum current through the transistor 3 can thus be set by means of adjusting the resistance of the resistor 5.

The capacitor 9 and the resistor 10 act as a differentiation element, by which the voltage at the node 8 is differentiated. If a sudden rise in the voltage at the node 8 occurs, then at the node between the capacitor 9 and the resistor 10 a control signal is generated, which ignites (i.e triggers) the thyristor 12. If a sudden voltage drop occurs, although this also causes a signal to be generated at the node between the capacitor 9 and the resistor 10, nevertheless because of its polarity this signal is not suitable for igniting the thyristor 12. If the thyristor 12 is ignited, then the gate voltage of the MOS transistor 3 is reduced so that flow of the blowing current from the calibration apparatus is thus turned off. The level of the voltage at node 8 is adjusted by means of the resistance of the resistor 4.

Figure 7:
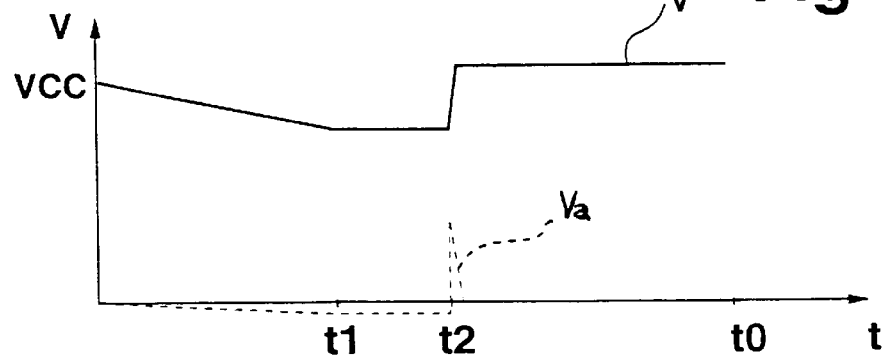
FIG. 7 shows the voltage course at measurement points of the apparatus of FIG. 2.

In FIG. 7, the voltage course at the node 8 is represented by the curve V shown in solid lines. When the MOS transistor 3 is turned ON by the voltage ramp of the pulse source 2 up to time t1, the voltage at the node 8 drops from the originally applied supply voltage $V_{cc}$ to a lesser value. The voltage drop at the node 8 is the product obtained by multiplication of the resistance of resistor 4 by the current flowing therethrough, adjusted via the current limiter 5, 7. Between time t1 and the blowing of s the fusible link at time t2, the voltage at the node 8 remains constant. When the fusible link blows at time t2, the voltage at the node 8 is then abruptly raised to a higher value again. At the node between the capacitor 9 and the resistor 10, the result is a sudden positive pulse, by which the thyristor 12 is triggered ON. As the curve Va shown in dashed lines indicates, which represents the voltage at the node between the capacitor 9 and the resistor 10, the dropping voltage up to time t1 produces only a slight negative signal. At time t2, at which a sudden rise in the voltage occurs at the node 8, a positive control signal is then generated, which turns ON the thyristor 12 (dashed-line curve in FIG. 7).

Figure 5:
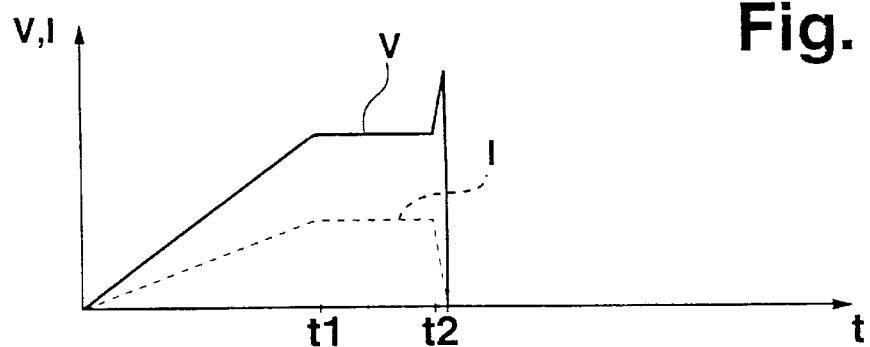
FIG. 5 shows the course of current and voltage according to the invention.

In FIG. 5, the voltage (solid-line curve V) applied between the two output lines 6 and 11, and the current I flowing through the lead 54 are shown. As can be seen, at time t2, only a brief overshoot of the voltage occurs, which cannot lead to a constant current flow through the circuit 53, since the MOS transistor 3 is turned OFF by the thyristor 12. Any further current flow through the IC 51 is interrupted at time t2, and damage to circuitry of the IC 51 is, thus, reliably prevented.

Figure 3:
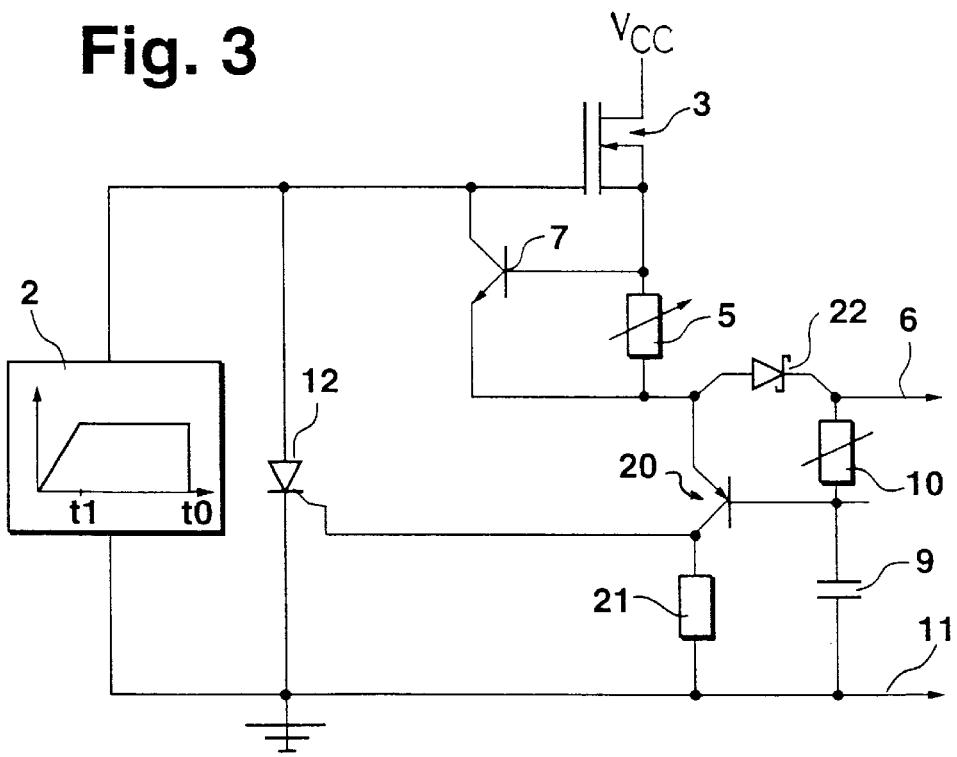

In FIG. 3, a second exemplary embodiment of the calibration apparatus of the invention is shown. The location of the pulse source 2, the thyristor 12, the MOS transistor 3 and the current limiter formed by the resistor 5 and transistor 7 is already known from FIG. 2. The output line 6 is connected to the adjustable resistor 10, the resistor 10 is connected to the capacitor 9, and the capacitor 9 is connected to the second output line 11 (ground). The capacitor 9 and the resistor 10 thus once again form a differentiation element, which is located between the first output line 6 and the second output line 11 (ground). The output line 6 is also connected via a Schottky diode 22 to the junction of resistor 5 and the emitter of the transistor 7. A pnp transistor 20 is also provided having its emitter connected to the emitter of the transistor 7, its base is connected to a node located between the resistor 10 and the capacitor 9, and its collector is connected via a resistor 21 to the second output line 11 (ground). The collector of the transistor 20 is connected to the control terminal of the thyristor 12.

Once again, a differentiating element is created by the resistor 10 and the capacitor 9. Here it forms the derivative of the voltage applied between the first output line 6 and the output line 11 (ground). The course of voltage between the two output lines 6 and 11 is identical both in FIG. 4 and in FIG. 5, up to time t2, and also applies to the FIG. 3 embodiment. Up to time t1, the voltage rises linearly between the two output lines 6 and 11. From time t1 up to the blowing of the fusible link at time t2, the voltage remains constant. Upon blowing of the fusible link, a brief, steep voltage rise then occurs.

Figure 6:
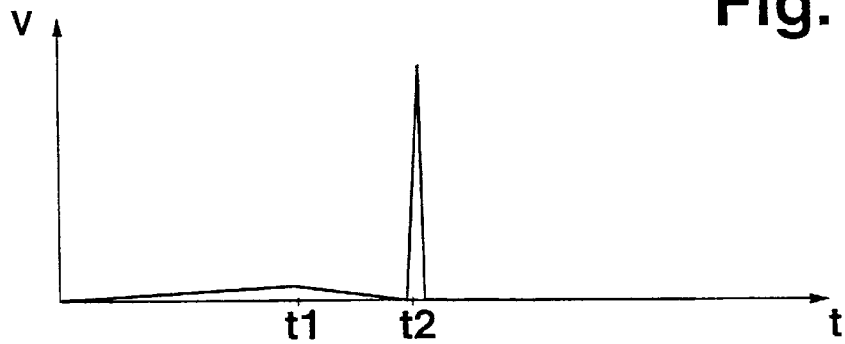
FIG. 6 shows the voltage course at a measurement point of the apparatus of FIG. 3.

In FIG. 6, the voltage course at the control terminal of the thyristor 12 is shown. As can be seen, in the rising phase up to time t1, because of the voltage ramp, only a slight positive control signal is produced at the control terminal of the thyristor 12. This signal is too slight to ignite the thyristor 12. Not until time t2, at which a strong signal occurs, is the thyristor 12 ignited. The transistor 20, and the resistor 21 that serves to set the operating point of transistor 20, bring about an amplification of the signal that appears at the node between the resistor 10 and the capacitor 9. A triggering of the thyristor 12 can thus be attained precisely at the moment when the fusible link has burned through. By means of the Schottky diode 22, a certain biasing of the transistor 20 is brought about. This provision increases the precision of the arrangement for detecting the blowing of the fusible link. However, it is also possible to leave out the diode 22 and to connect the emitter of the transistor 20 directly to the output line 6 and to the current limiter circuit. By a suitable choice of components, especially transistor 3 and thyristor 12, switching times on the order of magnitude of 100 nanoseconds can be attained.

For one skilled in the art, a number of variations of the circuit of the invention can be made without departing from the scope of the invention. For instance, instead of an MOS transistor 3, any other controllable elements, such as bipolar transistors, may be used. The transistors 7 and 20 and the thyristor 12 can also be replaced with other elements whose function has the same effect. For instance, instead of the thyristor 12, a suitably designed transistor, optionally with a memory element such as a flip-flop, can also be used. Moreover, the current limiter circuit, disclosed by way of example in the form of the transistor 7 and the resistor 5, need not be realized in that particular form. Other forms of current limiter circuits are also conceivable, and it is even optionally possible to dispense with this current limiter circuit entirely. Differentiation elements other than those shown may also be used.

In the circuit shown in FIG. 2, a signal Va is generated at the control terminal of thyristor 12 that differs in its sign from the signal generated by pulse source 2 during the rise time up to time t1. The time constant of the differentiation element, which can be adjusted by the choice of a suitable resistor 10, is therefore comparatively uncritical. However, since the resistor 4 is necessary for the function of the circuit, a higher supply voltage $V_{CC}$ than is necessary in the circuit of FIG. 3 is needed. In the circuit of FIG. 3, the resistor 10 must be adjusted comparatively precisely, because here it is primarily the steepness of the incident voltages that is evaluated. By means of the correct choice of the resistor 10, it must thus be assured that no control pulse for the thyristor 12 will occur during the rising phase up to time t1, while conversely at time t2 the steep rise leads to a control pulse for the thyristor 12.

Figure 8:
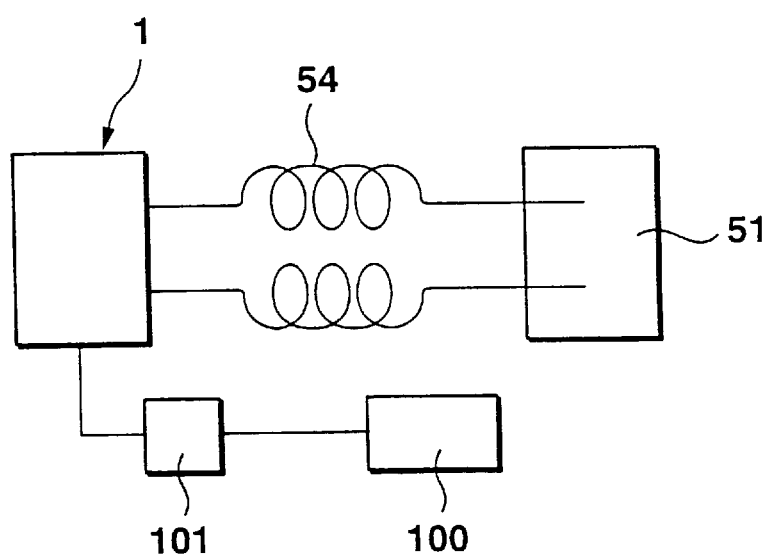
FIG. 8 shows a further arrangement for a calibration apparatus.

In FIG. 8, a further calibration apparatus 1 is shown, which is connected to the IC 51 by supply leads 54. The internal layout of the IC is equivalent to that known from FIG. 1. In addition, an antenna 100 with a signal processing means 101 is provided. The antenna 100 is located in the immediate vicinity of the IC 51. When the fusible links blow, the resultant sudden change in the current flow generates a major electromagnetic disturbance in the vicinity of the IC 51. This signal is detected by the antenna 100 and, after suitable amplification and filtering by the signal processing means 101, it is input to the calibration apparatus 1. There, the signal can be used directly to ignite a thyristor, in the manner known from FIGS. 2 and 3. It is, therefore, unnecessary to use any differentiating elements. The antenna 100 can simply be in the form of a thin metal foil located in the immediate vicinity of the fusible links.

It will be readily apparent to one with ordinary skill in the art that various other changes and modifications may be made, and features described in connection with any one of the embodiments may be used with any of the others, without departing from the scope of the present invention as defined by the following claims.

What is claimed is:

1. An apparatus for calibrating an integrated circuit (51, 53) having fusible links (52), comprising:

a supply voltage ($V_{cc}$);

means (1) for selecting one of the fusible links and supplying a blowing current by coupling said supply voltage thereto for blowing the selected fusible link to thereby render such nonconductive;

detecting means for detecting the blowing of said selected fusible link while the blowing current is still being supplied; and decoupling means coupled to said detecting means and responsive to detection of the selected fusible link being blown for decoupling said supply voltage from the integrated circuit to discontinue supply of the blowing current to the integrated circuit upon the selected fusible link having been blown and before damage to the integrated circuit occurs.

2. The apparatus of claim 1, wherein said means for selecting comprises:

a switch element (3) coupled to the supply voltage;

a first output line (6) coupled to the supply voltage ($V_{cc}$) via the switch element (3);

a second output line (11); and a first node interposed between the supply voltage ($V_{cc}$) and the fusible links;

wherein the detecting means comprises a differentiating element coupled between the first node and the second output line (11), the differentiating element generating a signal for turning off the switch element (3).

3. The apparatus of claim 2, wherein the switch element (3) comprises a transistor having a control terminal connected to a pulse source, and wherein the decoupling means comprises:

a switch (12) for coupling the control terminal to the second output line (11).

4. The apparatus of claim 3, wherein the differentiating element comprises:

a resistor (10);

a capacitor (9);

a second node interposed between the resistor (10) and the capacitor (9); and means for providing a signal present at the second node to the switch to render the switch (12) conducting in order to couple the control terminal to the second output line.

5. The apparatus of claim 1, wherein said means for selecting comprises:

a first resistor (4) coupled to the supply voltage;

a switch element (3) coupled to the supply voltage via the first resistor;

a third node (8) interposed between the resistor (4) and the switch element (3), the third node (8) being connected to a second output line (11) via said detecting means comprising a differentiating element including a capacitor (9) and a second resistor (10); and wherein said decoupling means comprises a switch (12) coupled to a second node between the capacitor (9) and the second resistor (10).

6. The apparatus of claim 1, further comprising:

a first output line;

a second output line (11) coupled to the first output line via said detecting means which comprises a differentiating element including a resistor (10) and a capacitor (9); and a second node interposed between the resistor (10) and the capacitor (9), the second node being coupled to said decoupling comprising a control input of a switch (12).

7. The apparatus of claim 6, wherein the second node is connected to the base of a pnp transistor (20), the collector of the pnp transistor (20) is connected to the control input of the switch (12) and, via a resistor (21), to the second output line (11), and the emitter of the transistor (20) is coupled to the first output line (6) by one of a direct connection and a Schottky diode (22).

8. The apparatus of claim 2, wherein the switch element (3) comprises a current limiter.

9. The apparatus of claim 1, further comprising:

an antenna (100) proximately located to the integrated circuit (51) to detect an electromagnetic disturbance caused by the blowing of said selected fusible link; and means coupled to the antenna to produce a signal for turning off the callibrating apparatus when said electromagnetic disturbance is detected.

10. A method for calibrating an integrated circuit having fusible links that are rendered nonconductive when blown by means of a blowing current provided thereto, the method comprising the steps of:

selecting one of the fusible links, and providing blowing current thereto;

monitoring the selected fusible link while the blowing current is being provided thereto to detect when the selected fusible link is blown; and discontinuing supply of the blowing current to the integrated circuit upon the selected fusible link having been blown.

* * * * *